(12) United States Patent
Yang et al.

(10) Patent No.: US 11,270,974 B2
(45) Date of Patent: Mar. 8, 2022

(54) EMBEDDED COPPER STRUCTURE FOR MICROELECTRONICS PACKAGE

(71) Applicant: FLEX LTD, Singapore (SG)

(72) Inventors: Cheng Yang, Pudong New Area (CN); Dongkai Shangguan, San Jose, CA (US); Li Yao, Pudong (CN)

(73) Assignee: FLEX LTD, Singapore (SG)

( * ) Notice: Subject to any disclaimer, the term of this patent is extended or adjusted under 35 U.S.C. 154(b) by 14 days.

(21) Appl. No.: 16/709,750

(22) Filed: Dec. 10, 2019

(65) Prior Publication Data

US 2021/0125958 A1 Apr. 29, 2021

(30) Foreign Application Priority Data

Oct. 24, 2019 (CN) .......................... 201911019157.8

(51) Int. Cl.
*H01L 21/50* (2006.01)
*H01L 23/00* (2006.01)
*H05K 1/02* (2006.01)
*H01L 23/367* (2006.01)

(52) U.S. Cl.
CPC ............ *H01L 24/92* (2013.01); *H01L 23/367* (2013.01); *H01L 24/16* (2013.01); *H01L 24/32* (2013.01); *H01L 24/48* (2013.01); *H01L 24/73* (2013.01); *H05K 1/0203* (2013.01); *H01L 2224/16225* (2013.01); *H01L 2224/32245* (2013.01); *H01L 2224/48155* (2013.01); *H01L 2224/73253* (2013.01); *H01L 2224/73265* (2013.01); *H01L 2224/92225* (2013.01); *H01L 2224/92247* (2013.01); *H05K 2201/066* (2013.01)

(58) Field of Classification Search
CPC ....... H01L 23/367; H01L 24/16; H01L 24/32; H01L 24/48; H01L 24/73; H01L 24/92; H01L 2224/92225; H01L 2224/92247; H05K 2201/066; H05K 2201/0203
USPC .................................. 257/706, 707; 438/122
See application file for complete search history.

(56) References Cited

U.S. PATENT DOCUMENTS

| | | | | |
|---|---|---|---|---|
| 5,481,136 A * | 1/1996 | Kohmoto | ............ | H01L 23/3677 165/80.2 |
| 5,583,378 A * | 12/1996 | Marrs | ...................... | H01L 24/97 257/710 |
| 6,175,497 B1 * | 1/2001 | Tseng | ...................... | H01L 23/36 257/706 |
| 6,373,131 B1 * | 4/2002 | Karnezos | ............ | H01L 23/3128 257/712 |
| 6,586,829 B1 * | 7/2003 | Yaniv | ................ | H01L 23/49811 257/693 |
| 6,625,028 B1 * | 9/2003 | Dove | ...................... | H01L 23/13 165/185 |
| 7,217,998 B2 * | 5/2007 | Tamagawa | ............. | H01L 23/36 257/707 |

(Continued)

*Primary Examiner* — Luan C Thai
(74) *Attorney, Agent, or Firm* — Weber Rosselli & Cannon LLP

(57) ABSTRACT

An electronic component and a method of manufacturing an electronic component, the method including surface mounting electronic components to a printed circuit board (PCB), applying a flip-chip die integrated circuit (IC) to the PCB and underfilling the flip-chip IC to secure the PCB. The method also includes sintering a copper block to the PCB, where the copper block is in thermal communication with the IC and acts as a thermal path for removing heat generated by the flip-chip IC.

19 Claims, 6 Drawing Sheets

(56) References Cited

U.S. PATENT DOCUMENTS

| | | | |
|---|---|---|---|
| 8,164,182 B2* | 4/2012 | Ong | H01L 23/3677 |
| | | | 257/707 |
| 8,390,013 B2* | 3/2013 | Tseng | H01L 24/83 |
| | | | 257/98 |
| 8,988,891 B2* | 3/2015 | Luo | H05K 1/021 |
| | | | 361/761 |
| 9,142,478 B2* | 9/2015 | Kim | H01L 25/105 |
| 10,034,375 B2* | 7/2018 | Pyper | H05K 1/021 |
| 10,104,759 B2* | 10/2018 | Viswanathan | H05K 7/20336 |

* cited by examiner

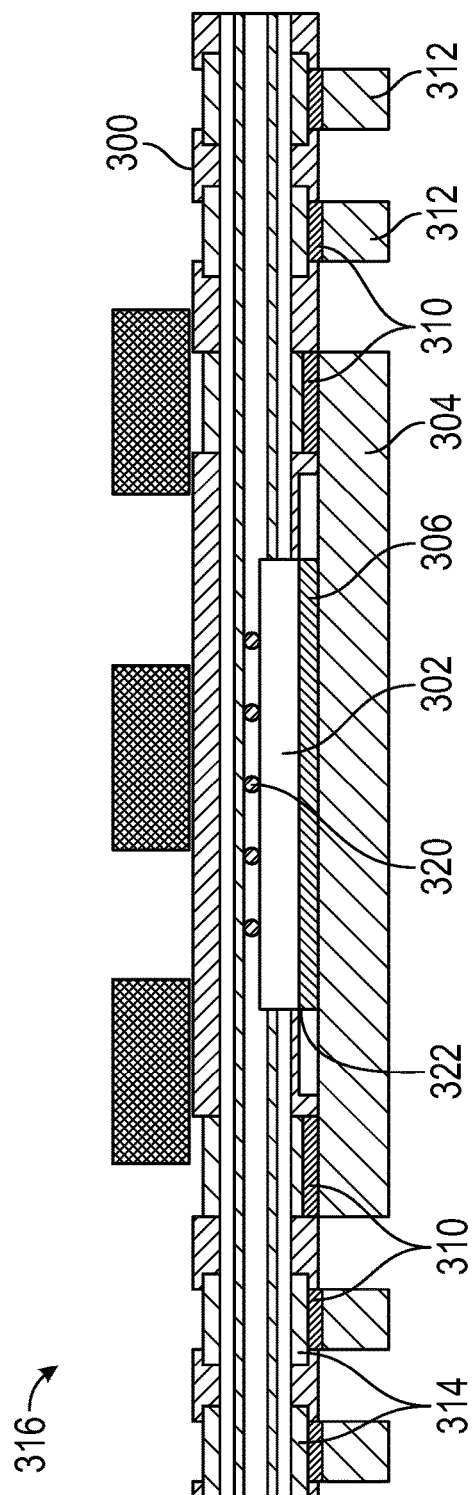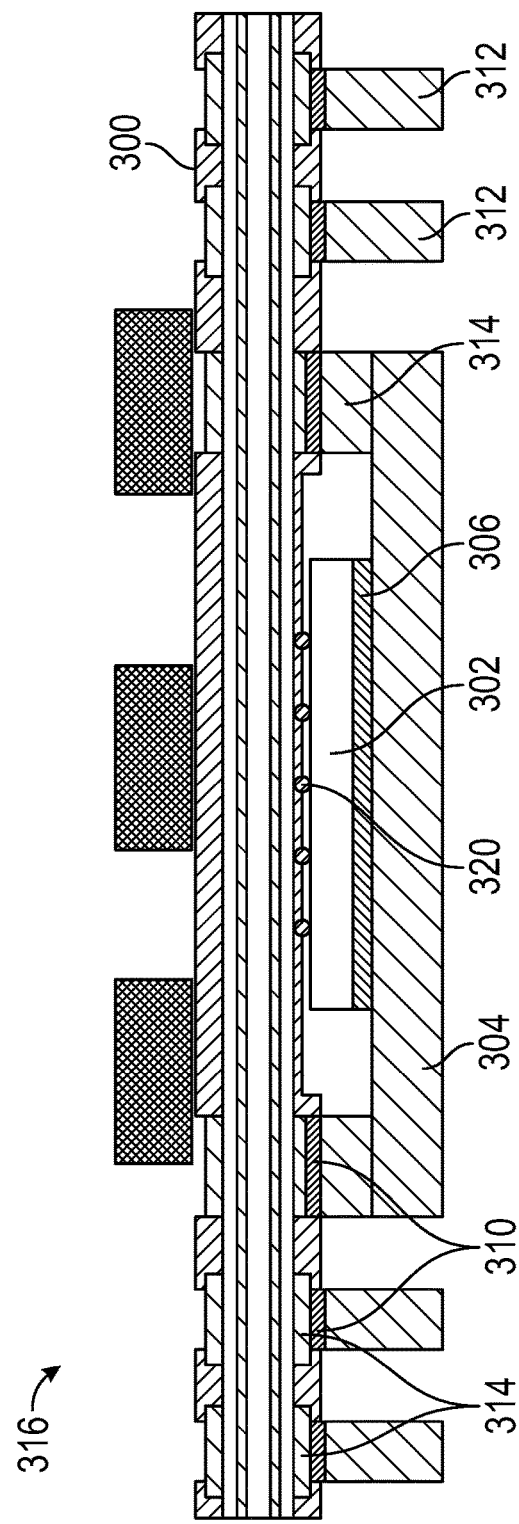

EMBEDDED COPPER STRUCTURE FOR MICROELECTRONICS PACKAGE

TECHNICAL FIELD

The disclosure relates to methods of electrically and mechanically connecting high power devices to a circuit board and particularly methods that reduce the overall thickness of the printed circuit board and increase its resilience to temperature in subsequent manufacturing steps.

BACKGROUND

There are a number of approaches for connecting power devices to a printed circuit board (PCB). Because of the heat generated by some of these power devices such as radio frequency (RF) transistors there is a need to add thermally conductive materials to the package to manage this generated heat. Typically, the integrated circuits (IC) having these RF transistors are mounted on a block or coin of copper. An example of such a configuration can be seen in FIG. 1A in a PCB 100 includes an IC 102 connected to the copper block 104 via a thermal bonding agent 106 (e.g., a thermally conductive adhesive or epoxy). The copper block 104 is adhered to the PCB 100. FIG. 1A depicts an example with a flat copper block. Wire bonds 108 connected the IC 102 to the PCB 100.

An alternative depicted in FIG. 1B includes a T-shaped copper block which is inset into the PCB 100. As can be seen the copper block 104 can be thinner than that depicted in FIGS. 1A and 1n fact is thinner than the PCB 100. In such a scenario the bottom side of the copper block may be flashed and plated for grounding connection. However, the thickness and the shape of the copper block 104 can be any suitable thickness and shape for the processing technology of the PCB 100. Where the copper block is the same thickness or larger than the PCB 100, both sides of the copper block 104 need be flashed to achieve the desired thicknesses.

A third method of connecting an IC 102 to the PCB 100 can be seen in FIG. 1C in which the copper block 104 is inserted into the PCB 100 as part of the prepreg lamination process. The embedded copper block 104 is flat on both the top and the bottom. These methods may also require embedding of copper layers into the PCB as part of its manufacturing process.

However, these methodologies have a number of short comings. They may require etching of the copper block to form input/output pads which can result in board warpage. The PCB board thickness is limited, it cannot be very thin because of the need for adhesion between the copper block and PCB. In addition, there are area ratio limits (i.e. the copper block cannot be too large when compared to the entire board area). Further, in prepeg lamination at least a 4-layer board is needed for copper inlay. 2-layers still need lamination regardless of whether the PCB is of coreless design (any layer process) or has core with removed copper foil. Further there are warpage control challenges when a large size copper block is employed.

There is a need for a method of connecting ICs to PCB's that address the shortcomings and drawbacks of the known art.

SUMMARY

One aspect of the disclosure is directed to a method of manufacturing an electronic component including: surface mounting electronic components to a printed circuit board (PCB), applying a flip-chip die integrated circuit (IC) to the PCB, underfilling the flip-chip IC to secure the PCB. The method also includes sintering a copper block to the PCB, where the copper block is in thermal communication with the IC and acts as a thermal path for removing heat generated by the flip-chip IC.

Implementations may include one or more of the following features. The method further including routing a cavity in the PCB to receive the flip-chip IC. The method where the copper block is thermally connected to the flip-chip IC by a thermal boding agent. The method further including grinding a backside of the copper block to surface finish. The method where the copper block is t-shaped. The method where the copper block is flat. The method where the sintering is low temperature sintering. The method where the low temperature sintering is performed under pressure. The method further including singulating the PCB to isolate a single electronic component. The method further including sintering copper columns to the PCB and connecting the copper block to the copper columns.

A further aspect of the disclosure is directed to a method of manufacturing an electronic component including routing a printed circuit board (PCB) to form an opening. The method also includes sintering a copper block to the PCB such that the copper block is arranged in the opening; surface mounting electronic components to the PCB, attaching an integrated circuit (IC) to the copper block, wire bonding the IC to the PCB. The method also includes overmoulding the PCB.

Implementations may include one or more of the following features. The method further including grinding a backside of the copper block to surface finish. The method where the opening is a hole passing through the PCB. The method where the opening is a cavity in the PCB. The method where the copper block is thermally connected to the IC by a thermal boding agent. The method where the copper block is t-shaped. The method where the copper block is flat. The method where the sintering is low temperature sintering. The method where the low temperature sintering is performed under pressure.

Yet another aspect of the disclosure is directed to an electronic component including: a printed circuit board including having an opening formed therein. The electronic component also includes an integrated circuit (IC) placed in the opening and connected to the printed circuit board. The electronic component also includes a copper block thermally connected to the (IC) and sintered to the PCB.

BRIEF DESCRIPTION OF THE DRAWINGS

Various aspects of the present disclosure are described hereinbelow with reference to the drawings, which are incorporated in and constitute a part of this specification, wherein:

FIG. 3A is a cross-sectional view of a flip-chip PCB in accordance with the disclosure;

FIG. 3B is a cross-sectional view of a further flip-chip PCB in accordance with the disclosure;

DETAILED DESCRIPTION

Further details and aspects of exemplary embodiments of the present disclosure are described in more detail below with reference to the appended figures.

The instant disclosure is directed to methods of connecting a copper block to a PCB using sintering techniques. As used herein, the term PCB includes other integrated circuit (IC) package substrates as used in electronics manufacturing. In accordance with the present disclosure the copper block is sintered directly onto the PCB. This allows the copper block to be reduced in size and no thick copper etching is required. Further these sintering techniques require no embedding of copper layers in the PCB. These advantages allow the PCB to be thinner without suffering the worst effects of warping and other damaging effects of the manufacturing process. While some warpage may still be experienced due to sintering, the use of low temperature techniques as described herein mitigates these effects.

One aspect of the disclosure is the level of the manufacturing process that the methods described herein occur. Traditional coin soldering is a PCB assembly manufacturing processes that occurs at Level 2 of the electronics hierarchy of interconnection levels. In contrast, the instant disclosure is directed to package level processes that occur at Level 1 of the electronics hierarchy of interconnection levels. In this manner the IC can be directly connected to the copper block (thermal pad) at a lower level of interconnection, reducing the number of processing steps required at the Level 2 interconnection level.

Figure 1A:
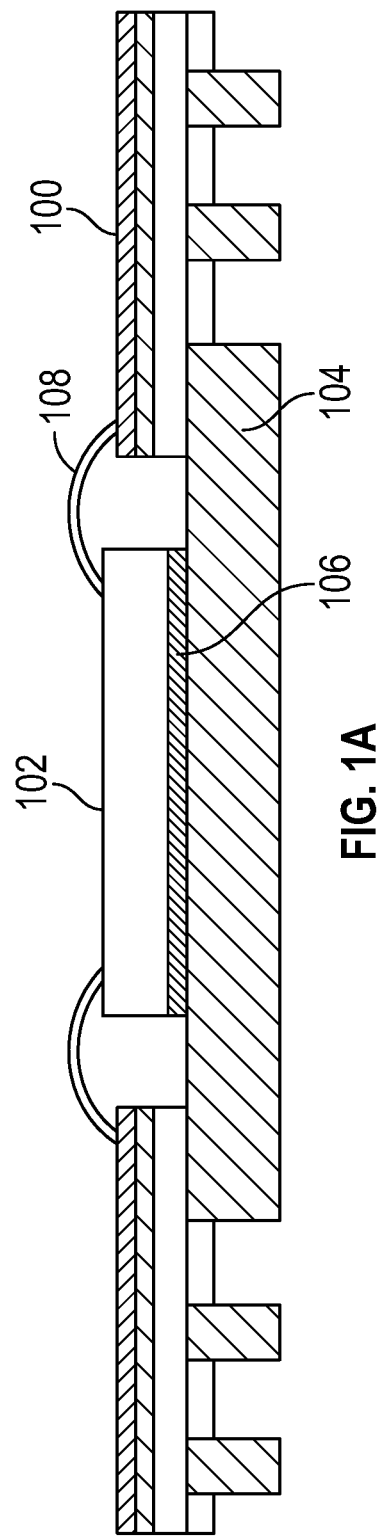
FIG. 1A is a cross sectional view of a PCB manufactured using known techniques.
Figure 1B:
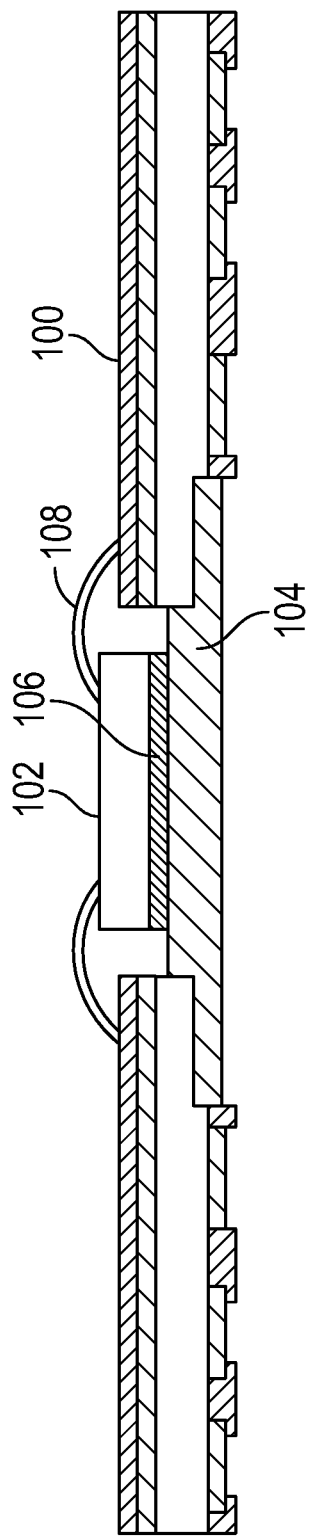
FIG. 1B is a cross sectional view of another PCB manufactured with known techniques.
Figure 1C:
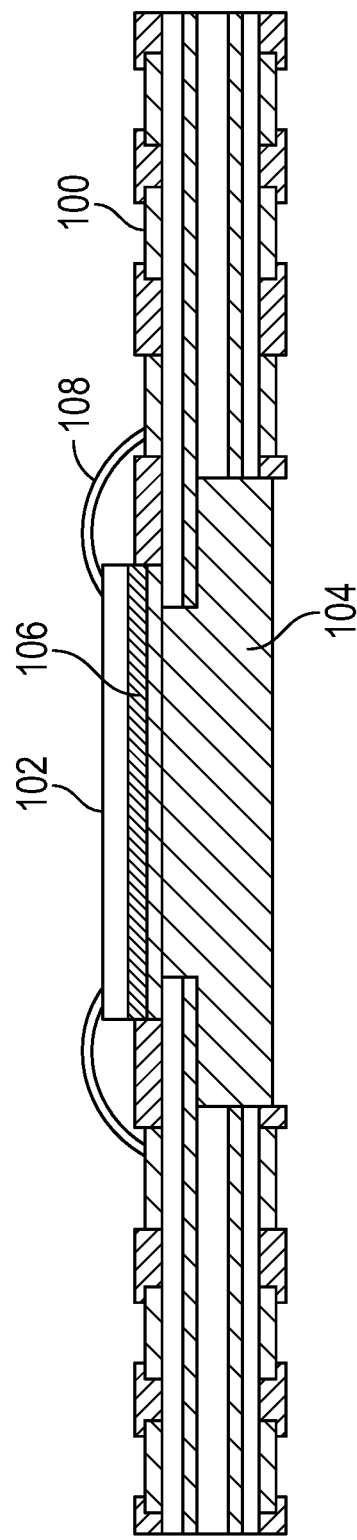
FIG. 1C is a cross sectional view of a further PCB manufactured with known techniques.
Figure 2A:
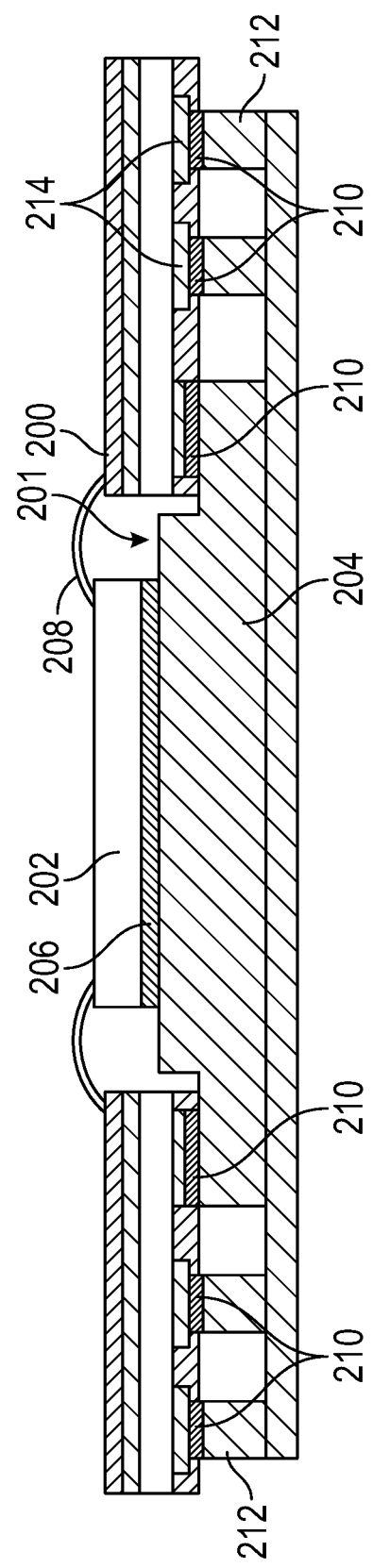
FIG. 2A is a cross sectional view of a PCB in accordance with the disclosure.

FIG. 2A is a representation of a PCB 200 in accordance with one aspect of the present disclosure. The PCB 200 includes a hole 201 within in which sits an IC 202 and a portion of a copper block 204. The IC 202 is adhered to a T-shaped copper block 204 with a bonding agent 206. Wire bonds 208 electrically connect the IC 202 to the PCB 200. The copper block 204 is adhered to the PCB 200 by application of sintering materials 210 and sintering techniques. The sintering may be low temperature sintering (e.g., about 200° C.) and may be undertaken either under pressurized conditions or unpressurized conditions. The sintering electrically connects the PCB 200 to the copper block 204, but at a lower temperature than traditional soldering processes. Additionally or alternatively, it is possible to sinter at higher temperatures and still experience the benefits of the disclosure because the sintering will not melt in subsequent processing steps such as reflow soldering. Copper columns 212 are also sintered to the input/output (I/O) pads 214 on the underside of the PCB 200 with sintering materials having been applied to the I/O pads 214.

It will be understood that the adherence of the IC 202 to the copper block 204 can be by a thermally and/or electrically conductive adhesive. Alternatively, the IC 202 may also be sintered to the copper block 204 using the same or different materials as used to sinter the copper block 204 to the PCB 200.

The sintering materials may be nano particle sintering materials or other sintering materials useable in connection the manufacture of power electronics. While adhesives can be used in electronics manufacturing, they tend to have lower thermal conductivity than sold metal interconnections, and thus are less desirable in forming the assembly depicted in for example FIG. 2A. Sintering, by contrast, has several benefits based on the materials employed and the result of the process. Like soldering, the end result of sintering is a solid metal interconnection joining, for example, the PCB 200 to the copper block 204 and thus has a relatively high thermal conductivity, typically much higher than that found by the use of adhesives. However, and importantly with respect to the instant application, unlike soldering or adhesives the interconnection will not easily re-flow upon application of heat. Thus, a sintered connection will not melt during subsequent surface-mount technology (SMT) processes in which surface-mount devices (SMD) are connected to the PCB 200. This aspect of sintering makes the multi-step processing of PCB's easier to accomplish because the substrate (e.g., the PCB 200 and copper block 204) can be manufactured at any time and subsequent SMT processes can be undertaken without fear of damaging the PCB to copper block interconnection.

Figure 2B:
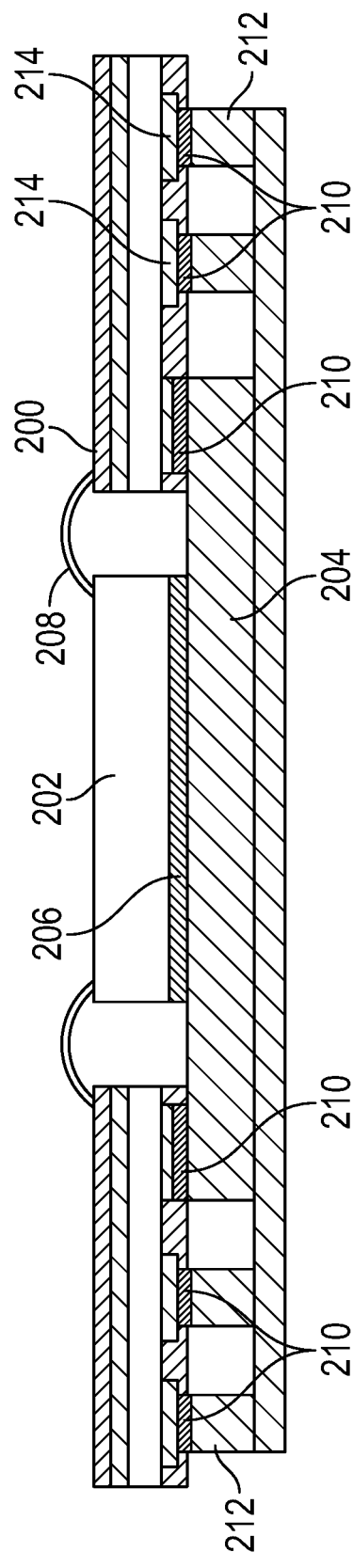
FIG. 2B is a cross sectional view of a further PCB in accordance with the disclosure.

FIG. 2B depicts a similar construction of a PCB 200 sintered to a flat copper block 204. Unlike the T-shaped copper block 204 in FIG. 2A, the flat copper block 204 allows the overall thickness dimension of the assembly in FIG. 2B to be the same as that in FIG. 2A, despite the IC 202 being significantly thicker in FIG. 2B.

Figure 2C:
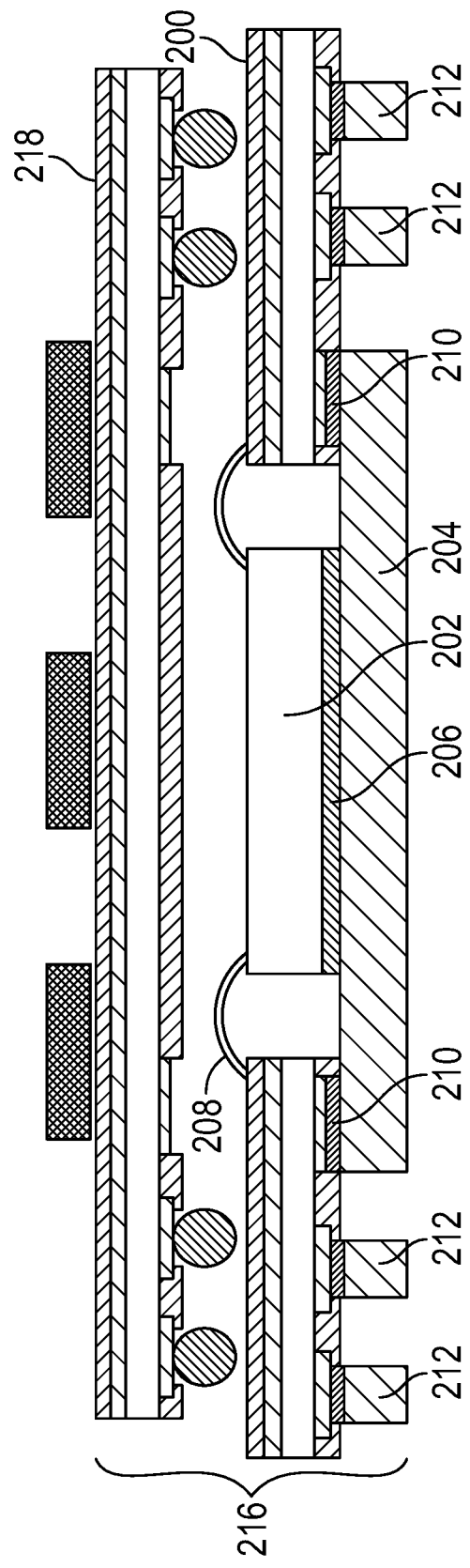
FIG. 2C is a cross-sectional view of a package-on-package PCB assembly in accordance with the present disclosure.

FIG. 2C depicts a package-on-package assembly 216, where a second PCB 218 is electrically connected to the PCB 200 of FIG. 2B. Though not shown in FIG. 2C, the PCB 200 will typically be encapsulated using molding techniques to protect the IC 202. Through-mold vias (also not shown) may also be part of the package-on-package construction to assist in the electrical interconnection of the two PCBs. Finally, the entire assembly can be encapsulated as required to reinforce the assembly and help maintain proper positioning of the components.

FIG. 3A depicts a further aspect of the present disclosure employing sintering to connect a copper block 304 to a PCB 300 using sintering materials 310 in a flip-chip design to create a flip chip assembly 316. As is known in the art, the use of flip-chip designs further promotes the reduction in size of the overall assembly. This is achieved by the connection of the IC 302 to one side of the PCB 300, while other electronic components may be added to a second side of the PCB 300 (e.g., using SMT processes). The IC 302 is connected thermally to the copper block 304 using a bonding agent 306 such as an adhesive or other technique as described above, and is connected to the PCB 200 using for example ball grid array 320 or other suitable technique that replaces the wire bonding 208 of the examples in FIGS. 2A-2C. The copper block 304 of FIG. 3A has a T-shape.

Again in FIG. 3A, copper columns 312 are also sintered to the input/output (I/O) pads 314 on the underside of the PCB 300 with sintering materials having been applied to the I/O pads 314. As depicted in FIG. 3A, rather than having a hole 201 extend through the PCB 200 (FIG. 2A), the PCB 300 has a cavity 322. The recess receives the IC 302 and allows for connection to the PCB 300. The copper block 304 effectively lifts the IC 302 to ensure contact with the PCB 300 in the cavity 322. The copper block 304 can be any shape including a T-shape as show in FIG. 2A or a flat shape as show in FIG. 3A.

FIG. 3B depicts an alternative to the flip-chip design of FIG. 3A where the PCB 300 has no cavity 322. As a result, additional copper columns 312 may be employed and connected to the copper block 304.

Figure 4:
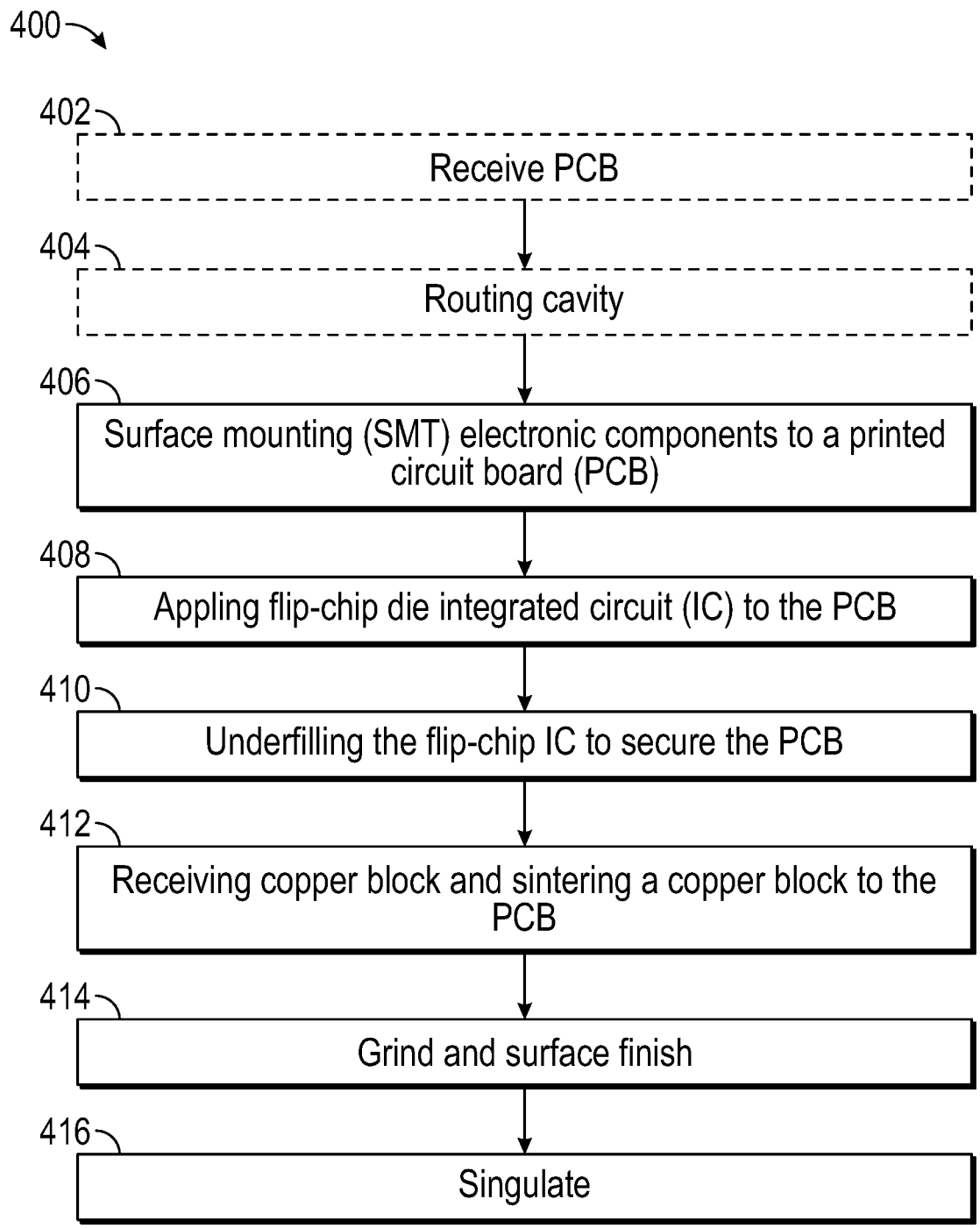
FIG. 4 is a flow chart for flip-chip PCB manufacturing in accordance with the disclosure.

FIG. 4 is a flow chart for manufacturing a flip-chip assembly in accordance with the present disclosure. As a first step 402 a substrate (e.g., PCB 300) is manufactured and received in the assembly system. At step 404, a cavity 322 is routed into the PCB 300. The cavity 322 is sized and shaped to receive the IC 302 and where a T-shaped copper bloc (e.g., 204 in FIG. 2A) is employed, at least a portion of the copper block. As will be appreciated, the routing of the cavity 322 may occur during PCB manufacturing such that the received PCB in step 402 already has the cavity machined therein. At step 406, the components on the second side of the PCB 300, opposite the side the IC 302 will be connected, can be mechanically and electrically connected to the PCB 300 using SMT.

Next at step 408, the IC 302 can be applied to and electrically connected to the PCB 300. Following connection of the IC 302 to the PCB 300, the IC can be underfilled at step 410. Underfilling is a step of applying an encapsulating and adhesive material to the underside of the IC 302 (the side connected to the PCB 300). The underfill material fills gaps between the interconnections of the PCB 300 and IC 302, protects the electrical connections (e.g., ball grid array 320) and further secures the IC 302 to the PCB 300. Following underfilling at step 410, the copper block 304 is sintered to PCB 300 at step 412. Step 412 includes the application of sintering materials to desired locations and the application of pressure to fuse those materials together and bind them to both the copper block 304 and the PCB 300. This may be also include the application of heat to assist in the transformation of the sintering materials (typically particulate in form) into a solid mass and may be performed under vacuum conditions to prevent corrosion. Further this step may include any additional preparation needed by the copper block 304 or the copper columns 312.

Following sintering, the copper block 304 is ground to a desired thickness at step 414 and finished to remove any undesirable material. Finally, at step 416 an individual PCB 300 can be singulated from a group of PCBs which are formed simultaneously in larger sheets. For example, 100 individual PCBs may be manufactured at one time on a common substrate. Though formed on a common substrate (e.g., a PCB ready to receive 100 ICs 302 and 100 copper blocks 304) this common substrate can be cut using dicing saws, laser cutters, and other techniques to separate individual PCBs 300 for use as an electrical component of a larger system.

Figure 5:
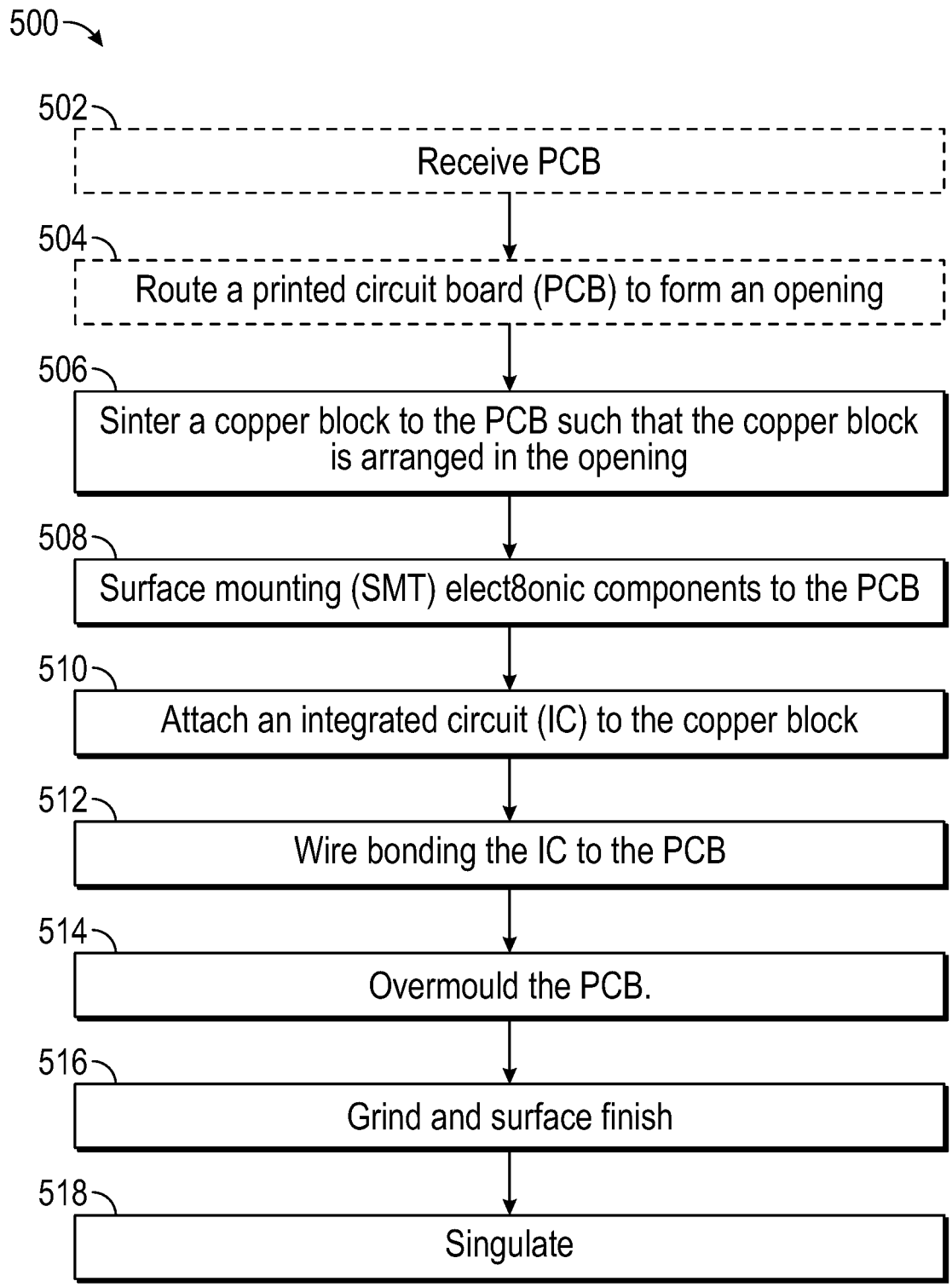
FIG. 5 is a flow chart for PCB manufacturing in accordance with the disclosure.

FIG. 5 depicts the process of forming a PCB 200 of FIG. 2A or 2B. Again, the process starts by receiving a PCB 200 at step 502. As noted above, and in conjunction with the singulation step 518, the PCB 200 may be a substrate that is designed to receive any number (e.g., 100) ICs 202 and copper blocks 204. Next an opening, either a hole 201 or a cavity 322 is routed into the PCB 200.

At step 506 a copper block 204 is sintered to the PCB 200. As above, step 506 includes the application of sintering materials to desired locations and the application of pressure to fuse those materials together and bind them to both the copper block 204 and the PCB 200. This may be also include the application of heat to assist in the transformation of the sintering materials (typically particulate in form) into a solid mass and may be performed under vacuum conditions to prevent corrosion. Further this step may include any additional preparation needed by the copper block 204 or the copper columns 212.

Once the PCB 200 and the copper block 204 are sintered, surface mounting of electrical and electronic components may be undertaken at step 508. Following SMT, the IC 202 can be attached to the copper block 204. As noted above this may be through the use of thermally conductive adhesives, or other techniques described herein or know to those of skill in the art. The IC 202 is then electrically connected to the PCB at step 512 by wire bonding the IC 202 to contacts on the PCB. Following wire bonding, the entire PCB 200 can be over molded (e.g., covered with encapsulant) to protect the electrical and electronic components, the wires of used for wire bonding and the IC 202.

Following over molding at step 516 the copper of the copper block can be ground back, and surface finished to remove any undesirable materials from its surface. Finally, at step 518 the PCB 200 can be singulated from a group of PCBs which are formed simultaneously in larger sheets, as described above.

While several embodiments of the disclosure have been shown in the drawings, it is not intended that the disclosure be limited thereto, as it is intended that the disclosure be as broad in scope as the art will allow and that the specification be read likewise. Any combination of the above embodiments is also envisioned and is within the scope of the appended claims. Therefore, the above description should not be construed as limiting, but merely as exemplifications of particular embodiments. Those skilled in the art will envision other modifications within the scope of the claims appended hereto.

We claim:

1. A method of manufacturing an electronic component comprising:
    surface mounting electronic components to a printed circuit board (PCB);
    applying a flip-chip die integrated circuit (IC) to the PCB on a side of the PCB opposite a side on which the electronic components are mounted;
    underfilling the flip-chip IC to secure the PCB; and
    sintering a copper block to the PCB to retain the flip-chip IC in a cavity in the PCB, wherein the copper block is in thermal communication with the flip-chip IC and acts as a thermal path for removing heat generated by the flip-chip IC.

2. The method of claim 1, further comprising routing the cavity in the PCB to receive the flip-chip IC.

3. The method of claim 1, wherein the copper block is thermally connected to the flip-chip IC by a thermal boding agent.

4. The method of claim 1, further comprising grinding a backside of the copper block to surface finish.

5. The method of claim 1, wherein the copper block is T-shaped.

6. The method of claim 1, wherein the copper block is flat.

7. The method of claim 1, wherein the sintering is low temperature sintering.

8. The method of claim 7, wherein the low temperature sintering is performed under pressure.

9. The method of claim 1, further comprising singulating the PCB to isolate a single electronic component.

10. The method of claim 1, further comprising sintering copper columns to the PCB and connecting the copper block to the copper columns.

11. A method of manufacturing an electronic component comprising:
  routing a printed circuit board (PCB) to form an opening;
  sintering a copper block to the PCB such that the copper block is arranged in the opening to form a PCB and copper block assembly;
  surface mounting electronic components to the PCB of the PCB and copper block assembly;
  attaching an integrated circuit (IC) to the copper block of the PCB and copper block assembly;
  wire bonding the IC to the PCB of the PCB and copper block assembly; and
  overmoulding the PCB of the PCB and copper block assembly.

12. The method of claim 11, further comprising grinding a backside of the copper block of the PCB and copper block assembly to surface finish the copper block.

13. The method of claim 11, wherein the opening is a hole passing completely through the PCB.

14. The method of claim 11, wherein the opening is a cavity formed in the PCB and extending partially through the PCB.

15. The method of claim 11, wherein the copper block of the PCB and copper block assembly is thermally connected to the IC by a thermal boding agent.

16. The method of claim 11, wherein the copper block is T-shaped.

17. The method of claim 11, wherein the copper block is flat.

18. The method of claim 11, wherein the sintering is low temperature sintering.

19. The method of claim 18, wherein the low temperature sintering is performed under pressure.

* * * * *